United States Patent
Khadilkar et al.

(10) Patent No.: US 8,043,721 B2
(45) Date of Patent: Oct. 25, 2011

(54) METHOD OF MAKING MULTILAYER STRUCTURES USING TAPES ON NON-DENSIFYING SUBSTRATES

(75) Inventors: Chandrashekhar S. Khadilkar, Broadview Heights, OH (US); Srinivasan Sridharan, Strongsville, OH (US); Aziz S. Shaikh, San Diego, CA (US)

(73) Assignee: Ferro Corporatiom, Cleveland, OH (US)

( * ) Notice: Subject to any disclaimer, the term of this patent is extended or adjusted under 35 U.S.C. 154(b) by 211 days.

(21) Appl. No.: 12/464,980

(22) Filed: May 13, 2009

(65) Prior Publication Data

US 2009/0220799 A1 Sep. 3, 2009

Related U.S. Application Data

(62) Division of application No. 11/468,798, filed on Aug. 31, 2006, now Pat. No. 7,547,369.

(51) Int. Cl.
*B32B 19/00* (2006.01)
(52) U.S. Cl. ........................................ 428/689; 428/688
(58) Field of Classification Search .................. 428/426, 428/432, 688, 689
See application file for complete search history.

(56) References Cited

U.S. PATENT DOCUMENTS

| | | | |
|---|---|---|---|
| 4,935,844 A | 6/1990 | Burn | |
| 5,008,151 A | 4/1991 | Tominaga et al. | |
| 5,070,047 A | 12/1991 | Gardner et al. | |
| 5,071,794 A | 12/1991 | Shaikh | |
| 5,120,579 A | 6/1992 | Gardner et al. | |
| 5,164,342 A | 11/1992 | Muralidhar et al. | |
| 5,397,830 A | 3/1995 | Shaikh et al. | |
| 5,657,532 A | 8/1997 | Alexander et al. | |
| 5,889,322 A * | 3/1999 | Hamada et al. | 257/701 |
| 5,897,912 A | 4/1999 | Shaikh | |
| 6,348,425 B1 | 2/2002 | Barattini et al. | |
| 6,413,890 B1 | 7/2002 | Goto | |
| 6,592,696 B1 | 7/2003 | Burdon et al. | |
| 6,811,634 B2 * | 11/2004 | Hashimoto et al. | 156/89.12 |
| 6,982,864 B1 | 1/2006 | Sridharan et al. | |
| 7,547,369 B2 | 6/2009 | Khadilkar et al. | |
| 2003/0171202 A1* | 9/2003 | Oobuchi | 501/8 |
| 2005/0266252 A1 | 12/2005 | Rita | |
| 2005/0276002 A1 | 12/2005 | Sridharan et al. | |
| 2005/0277550 A1 | 12/2005 | Brown et al. | |

* cited by examiner

*Primary Examiner* — Gwendolyn Blackwell
(74) *Attorney, Agent, or Firm* — Rankin, Hill & Clark LLP

(57) ABSTRACT

A method of applying a ceramic coating to a substrate comprises laminating one or more layers of a green ceramic tape to a rigid substrate using a tackifying resin to adhere the tape to the substrate. Upon firing, the tackifying resin ensures near zero shrinkage of the tape in the XY plane without usage of elevated pressures or temperatures during lamination of green tape to the substrate. The thermal degradation completion temperature of the tackifying resin is lower than that of the resin binder used in the green tape.

19 Claims, No Drawings

METHOD OF MAKING MULTILAYER STRUCTURES USING TAPES ON NON-DENSIFYING SUBSTRATES

FIELD OF THE INVENTION

The invention relates to a method of applying a ceramic coating to a rigid substrate by gluing unfired (green) tapes to the substrate where the green tape does not shrink in the XY plane during the firing cycle. The adhesive "glue" prevents or substantially reduces XY plane shrinkage in the tape layer(s) and prevents and/or substantially reduces defects such as tears, voids, and edge cracking related to constrained sintering of the tape on a rigid substrate.

BACKGROUND

Manufacture of multi-layered electronic parts using tapes involves lamination. During lamination various ceramic green tape layers are stacked together and formed into a ceramic laminate ("monolith") using heat and/or pressure. Certain strategies have also been developed requiring the use of heat and/or pressure in the attempt to minimize area (XY plane) shrinkage.

In one known method, one or more ceramic green tape layers are stacked and laminated using either a uniaxial or an isostatic press. A typical lamination requires temperatures of 50 to 120° C. and pressures of 500 to 7000 psi. The laminating temperature and pressure are optimized to fuse the tape layers together. For an isostatic lamination, the additional step of vacuum bagging is also required.

Another known method involves using a pressure sensitive adhesive layer to bond tape layers together to reduce or eliminate the need for elevated lamination pressure and temperature. After the lamination step, parts are typically cut ("singulation") and fired. The ceramic tape laminate shrinks during the binder removal and firing cycle. The tape shrinkage is typically greater than 10% in the X and Y plane directions and greater than 15% in the Z (thickness) direction. In this known method, the tape shrinkage depends on various factors including the setters, firing profile, tape inorganic composition, tape laminate density, binder amount, metal content of the package, and glass powder properties such as oxide content and particle size distribution. The tight shrinkage control required for certain multi-layered circuits is difficult to achieve due to the number of factors affecting shrinkage during firing for systems containing tapes and inks. Thus, there is room for improvement in the art.

SUMMARY OF THE INVENTION

In general, the present invention provides a method of applying a ceramic coating to a substrate. In particular, the invention provides a method for applying a ceramic coating to a substrate comprising: applying a tackifying resin to at least one of a green ceramic tape and a rigid substrate, laminating together, at a lamination pressure of less than about 100 psi, the green ceramic tape and the substrate to form a monolith, and firing the monolith at a temperature and a time sufficient to flow and densify the glass component. The green ceramic tape comprises a solids portion and an organics portion. The solids portion comprises a glass component and the organics portion comprises a polymer resin. The tackifying resin may be one or more of rosin resins, terpene resins, hydrocarbon resins and combinations thereof. The green ceramic tape exhibits less than 5% area shrinkage during firing.

In another embodiment, the invention provides a method of making a component comprising: applying a tackifying resin to at least one of a rigid substrate and a green ceramic tape comprising a glass component, contacting together the rigid substrate and the layer of green ceramic tape, through the tackifying resin, laminating the substrate and the at least one layer of green tape such that the tackifying resin adheres together the substrate and the tape to form a monolith, using a lamination pressure of less than about 100 psi, and firing the monolith at a temperature and a time sufficient to flow the glass component.

In a preferred embodiment, the invention provides a method for applying a porcelain enamel coating to a substrate comprising: applying a tackifying resin to at least one of a green ceramic tape and a rigid substrate, wherein the tackifying resin is selected from the group consisting of (a) dehydroabietyl alcohol (which has Chemical Abstracts Service Registry Number (CASRN) 133393-93-6) and (b) a substance having a CASRN of 65997-05-9. The green ceramic tape is made from a slurry comprising about 50 to about 70 wt % of a glass composition, about 0.1 to about 10 wt % of a dispersant, about 20 to about 40 wt % of an organic solvent, about 0.1 to about 10 wt % of a polymer resin, and about 0.1 to about 10 wt % of a plasticizer. The green ceramic tape and the substrate are laminated together at a lamination pressure of less than about 100 psi, thus forming a monolith. The monolith is fired at a temperature and a time sufficient to flow and densify the glass component. The green ceramic tape exhibits less than 5% area shrinkage during firing.

The tackifying resin acts as glue between the substrate and the one or more layers of green tape applied thereto. Minimal pressure may be needed to hold glued parts together to evenly adhere the tape and the substrate, or to adhere successive layers of tape to one another, typically less than about 100 psi. Further, pressure need not be maintained during firing to prevent XY plane shrinkage of the tape. Further still, such lamination can be done at a relatively low temperature, e.g., in the range of room temperature (15-30° C.), or broadly about 1° C. to about 100° C. Five, ten, or more tape layers can be so glued with the tackifying resins herein. The firing temperature (i.e., furnace set temperature) must be sufficient to flow the glass component, typically about 300° C. to about 1200° C., preferably about 400° C. to about 1100° C., more preferably about 500° C. to about 1050° C. The firing may take about 1 minute to about 60 minutes, preferably about 2 minutes to about 30 minutes.

The major benefits of this method are: (a) little or no shrinkage in the XY plane of the tape upon firing (5% or less, and typically 2% area shrinkage or less), which leads to tighter dimensional control of a component made by the method, such as a circuit; (b) elimination of high-pressure, high-temperature lamination step; (c) ease of automation; and (d) reduction of repetitive print-dry-fire cycles used to build thicker dielectric layers using known screen printing methods.

The method described herein can be used where parts requiring tighter dimensional control can be glued to a partially prefabricated circuit. Articles comprising the rigid coated substrates made by the processes disclosed herein, including electronic components, electrical devices, appliances, automotive components, and decorative pieces are also envisioned. Paste compositions comprising any glass composition and paste compositions comprising any solids portion composition as disclosed herein are also envisioned.

The solids portion compositions disclosed herein may take the form of dry powders, and with the proper addition of organic solvents, binders and/or vehicles, it is possible to form pastes, inks, or slurries. The compositions may be applied to a substrate by procedures including screen printing, decal application, wet spray, dry spray, electrophoretic deposition, and dipping.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

The methods herein involve the fabrication of a coating or coated structure, which may be predominantly ceramic, glassy, ceramic and glass, metal and glass, or inorganic-organic hybrids, on a substrate. The methods are called alternately "enameling," "glazing," "decal processing," "tape processing" or simply "metallization." Metal substrates made with a coating of glass, ceramic, or glass-ceramic may be called "metal cored substrates" (MCS).

The methods of the present invention may advantageously be used to add additional layers of a glass-, ceramic-, or glass-ceramic-coating to a pre-fabricated electronic element as the substrate. Exemplary pre-fabricated electronic elements include heaters, sensors, ceramic chip capacitors, multi-chip modules, integrated circuit packaging, fuel cells, solar cells, plasma screen displays, light emitting diodes, appliances, automotive components, ceramic cook tops, and oven cavities. An overglaze layer may also be applied prior to the application of tape to the substrate. Such pre-fabricated electronic elements may also include stacked layers of green ceramic tape, or other commonly used electronic components. The major types of components and ingredients concerned are detailed herein.

Substrates. Typical substrates useful in the practice of the inventive method include, broadly, metal, glass, ceramic, and glass-ceramic. These substrates may be termed non-densifying or "rigid." The term "rigid," as used herein means that the substrate itself does not sinter, densify, or shrink during firing. Hence, over the ranges of firing temperatures disclosed herein, a non-densifying substrate presents an essentially constant geometry upon which to build the disclosed tape layers, which do not shrink in the XY plane.

Metal Substrates. Broadly, metal substrates include those made of any metal except mercury. Iron and its alloys, including low carbon steel (i.e., mild steel); stainless steels including 300 and 400 series; cast iron; aluminum and its alloys; and copper and its alloys, are suitable metal substrates. Metals coated with other metals may be suitable such as copper clad molybdenum or nickel-plated copper. Aluminum and its alloys are used where low weight and low temperatures are needed. Titanium and its alloys are alternatives when low weight is needed. Copper and its alloys are useful for their exceptional heat conduction properties.

In high temperature and high stress environments, in addition to iron and its alloys, such as steels, super alloys based on nickel are very useful as substrates. Further, specialized iron alloys, including INVAR®, a ferronickel alloy which has a low thermal coefficient of expansion (TCE), and KOVAR®, an iron/nickel/cobalt alloy, can also be used. Both are available from Carpenter Technology of Wyomissing, Pa.

Glass, Ceramic, and Glass-Ceramic Substrates. Typically useful glass substrates include, but are not limited to, soda lime silica (SLS) glass substrates such as those used in (a) automotive windshield, sidelite, and backlite applications, and (b) displays such as plasma display panels (PDP). Typical examples of SLS automotive glasses are those tempered or laminated float glass products known in the automotive industry by various trade names such as Sungate® windshields manufactured by PPG Industries, Pittsburgh, Pa.; S-Bend Backlite® by Pilkington Group Limited, Merseyside, UK; Tinted Solarshield™ by AFG Industries, Kingsport, Tenn. A typical example of PDP glass substrates is PD200 brand from Asahi Glass Co., Ltd., Tokyo, Japan, and similar such display glasses marketed by Nippon Sheet Glass Co., Ltd., Tokyo, Japan. Ceramic substrates include well-known substrates such as alumina substrates used widely in electronic industry, and ceramic tiles. Typically useful glass-ceramic substrates include, but are not limited to, low expansion or nearly-zero expansion lithium aluminosilicate glass-ceramic substrates such as Ceran® brand ceramic cooktops manufactured by Schott AG, Mainz, Germany, Neoceram® manufactured by Nippon Electric Glass Co., Shiga, Japan.

Tackifying Resin. The inventors herein have discovered that the use of a tackifying resin between a rigid substrate and a green tape, or between successively stacked green tape layers, adheres them together while eliminating the need for complicated processing conditions, and ensures zero or near-zero area shrinkage during firing. In contrast, known methods of laminating a green tape to a rigid substrate require substantial lamination pressure to initially adhere the tape to the substrate and to prevent area shrinkage of the tape during firing.

Preparation and application of a tackifying resin includes dissolving the tackifying resin in a suitable solvent. The choice of solvent (one or more) and the amount of tackifying resin in the solution (about 5-90 wt % tackifying resin) is determined by the desired solution viscosity, which in turn is determined by the solution application method and the desired solvent evaporation rate. The tackifying resin solution is applied to the substrate using techniques such as dipping, spraying, screen-printing, and others as known in the art. The substrate is partially dried to get a thin (<50 microns) tacky coating of the tackifying resin. The green tape is subsequently attached to the tacky coating (glue). A small amount of residual solvent can help to bond the substrate to the green tape by dissolving a portion of the polymer resin from the tape. The green tape used herein may be applied with minimal lamination pressure, such as that which may be applied by hand: about 200 psi or less, preferably about 100 psi or less or more preferably about 50 psi or less and even more preferably about 25 psi or less. The thermal decomposition initiation temperature and thermal degradation completion temperature of the glue are generally lower than that of the resin binder used in the green tapes. The glue provides adequate adhesion between the green tape and substrate during initial stages of heating in a firing cycle (<300° C.) where the de-bonding stresses are more severe.

Broadly, tackifying resins useful in the methods herein include rosin resins, terpene resins, hydrocarbon resins, and polymerized resins. The degree of tack or "stickiness" of an adhesive tackifying resin can be quantified by the acid number (AN). As is known in the art, the acid number is expressed as the milligrams of KOH needed to neutralize a gram of sample, in accordance with ASTM D-465. Useful tackifying resins herein have acid numbers that range from about 0.1 to about 170. Certain useful tackifying resins have acid numbers from about 120 to about 170, while others have acid numbers of about 80 to about 120, and still others have acid numbers of about 0.1 to about 80. Tackifying resins are also described in terms of the softening temperature ($T_{sf}$). In order to reduce or eliminate the need for extreme heating of a tackifying resin prior to application and lamination, the most useful tackifying resins herein have softening temperatures of no more than about 150° C.

Rosin Resins. Rosin resins are derived from three sources: gum rosin, wood rosin and tall oil rosin, all ultimately generated from the pine tree. Gum rosin is the oleoresin of the living pine tree. The most common rosin resin type used in adhesives is rosin esters, which are ideal to impart excellent, aggressive adhesion to almost all polymer types, including acrylates, natural rubber, ethylene-vinyl-acetate (EVA), styrene-butadiene-rubber (SBR), styrene-isoprene-styrene rubber (SIS), and styrene-butadiene-styrene rubber (SBS).

Useful rosin resins herein include those based on abietic acid, such as abietic type rosins, glycerol esters of abietic type rosins, pentaerythritol esters of abietic type rosins, methyl esters of abietic type rosins, pimaric type rosin, glycerol esters of pimaric type rosin, pentaerythritol ester of pimaric type rosins, methyl esters of pimaric type rosins, tall oil rosins, glycerol esters of tall oil rosins, pentaerythritol esters of tall oil rosins, methyl esters of tall oil rosins, fully or partially hydrogenated versions of all of the foregoing, and blends thereof.

In general, tackifying resins such as alpha methyl styrene resins, polyamide adhesive resins, polyterpene resins, polymerized rosin, rosin esters, styrenated terpene resins, tackifier dispersions and terpene-phenol resins are suitable. Suitable rosins include those sold by Arizona Chemical under the trade names Sylvalite®, Sylvatac® and Sylvagum®. Commercial examples include Sylvagum® RE 85K, a glycerol ester of tall oil resin having a Chemical Abstracts Service Registry Number of 8050-31-5; Sylvalite® RE 100L, a stabilized pentaerythritol ester of rosin (CASRN, 8050-26-8). Preferred tackifying resins include Eastman Abitol®-E (Dehydroabietyl Alcohol) having a softening temperature ($T_{sf}$) under 25° C., an acid number (AN) of 0.3, and CASRN of 133393-93-6. Wood rosins include Eastman Dymerex® polymerized wood rosin having AN about 130 to about 155 and a $T_{sf}$ of about 138° C. to about 151° C.; Arizona Chemical Sylvaros® PR R-85 polymerized wood rosin having AN of about 155 to about 162 and $T_{sf}$ about 79° C. to about 85° C.; Arizona Chemical Sylvaros® PR 140 polymerized wood rosin having AN of about 133 to about 147 and a $T_{sf}$ of about 135° C. to about 148° C. Each of the foregoing polymerized wood rosins has a CASRN of 65997-05-9.

Tapes. Green tapes are formed, at the most basic level, by uniformly dispersing glass frit particles (powder) and other inorganic materials in an organic binder solution to form a slurry using water, organic solvents, or both. This slurry is cast (by doctor blade or knife casting) into a generally flexible, self-supporting green ceramic sheet, typically with a specified width (from one or two inches to five feet or more) and thickness (e.g., about 10 microns to about 1 mm thick), and a length that is often limited only by packaging and/or transport constraints. The tape is dried to remove the organic components, mostly the solvents. Tape casting may be run as a continuous process. A "green ceramic tape" is a dry (i.e., organic solvent removed) unfired sheet comprising one or more glass frits, organic binders, plasticizers and additives.

The tapes also have smooth surfaces suitable for accurate printing to form e.g. conductive patterns. When it is necessary to form a conductive pathway, a screen printable paste will be used to deposit the desired pattern on a tape; the screen printable paste will have a desired formulation to make a conductor or resistor upon firing.

The methods of the present invention may be used for applying a ceramic coating to a rigid substrate. The methods herein may also be used in forming conductive or resistive electronic or electric elements using appropriate pastes as known in the art. The conductive and resistive pastes can be deposited on a green tape and then glued to the substrate and fired or deposited on a pre-fired tape on a rigid substrate and subsequently fired.

When multi-layer circuits having conductive elements are made, the green tape sheets are first fabricated, and punched with via holes, which are then filled by screen printing using via fill inks, followed by screen printing a conductor pattern thereon in a conventional manner, using conventional conductor inks. Between successive tape layers, one or more tackifying resins, as discussed hereinabove, is applied in order to glue the layers together and to minimize or eliminate area shrinkage of the tapes during binder removal and firing. The green tapes are stacked, aligned over the rigid substrate and fired. The tackifying resin is also applied over the substrate to improve adhesion of the multilayer green ceramic monolith to the substrate. During firing the tackifying resin, which has a lower softening temperature than that of the glass, softens and adheres the ceramic tape to the substrate, preventing area shrinkage during binder removal and firing. Shrinkage then occurs only in the Z (thickness) direction. Thus the alignment of the ceramic layers to each other, and the stack to the support substrate, remains undisturbed during firing.

Tape Glasses. The tapes herein comprise a glass composition, which may include any glass composition typically used in electronics materials processing, decorative glasswork, porcelain enameling, automotive windshields or ceramic decoration. In environmentally sensitive applications, the coatings (i.e., glass compositions) may be substantially free of lead and cadmium. As used throughout the instant specification in the appended claims, the phrase "lead-free and cadmium-free" means that no lead, or PbO, cadmium, or CdO, has been intentionally added to the composition, and that the composition comprises less than about 0.1% by weight Pb or Cd after firing.

The dividing lines between glass, glass-ceramic, and ceramic are not well defined. "Glass" is theoretically completely amorphous and non-crystalline. A "glass-ceramic" contains crystalline phases, mainly crystallized from a glass during heating, i.e. it is a mixture of crystalline phases in a glassy matrix. A ceramic contains predominantly crystalline phases, which may not have been crystallized out of a glass.

A typical glass is a barium borosilicate glass. Glass-ceramics include for example, $BaO.SiO_2$, $CaO.SiO_2$, $CaOMgO.2SiO_2$, $Bi_2O_3.SiO_2$, $Li_2O.Al_2O_3.4SiO_2$, $CaO.Al_2O_3.2SiO_2$, $Li_2O.2SiO_2$, and many other oxide compositions. Also, mixtures of glassy compositions and crystalline fillers are envisioned The particular glass may be selected based on the desired application of the green tape. Glass is an amorphous material comprising elemental oxides, the nature of which determine the physical properties of the glass, such as Tg (glass transition temperature), viscosity, porosity, translucency, dielectric constant, volume resistivity, chemical durability, and TCE. Any type of glass known in the art of electronics materials having a Tg of about 250° C. to about 850° C. may be used in the tape that is fired to form the enamel.

For example, the solids portion of the green tapes may contain glasses based on borosilicates, alumino silicates, alkali titanium silicates, alkali titanium vanadium silicates, barium based glasses, calcium based glasses, magnesium based glasses, strontium based glasses, phosphate glasses, zinc based glasses, lithium based glasses and bismuth based glasses. Combinations of the foregoing are possible. For example, boro-aluminosilicate, barium borosilicate, barium calcium borosilicate, calcium aluminum borosilicate, calcium magnesium aluminosilicate, and calcium aluminosilicate. Further suitable are glasses containing various combinations of $Al_2O_3$, $Bi_2O_3$, $SiO_2$, $B_2O_3$, MgO, $TiO_2$, $ZrO_2$, $Li_2O$, $Na_2O$, $K_2O$, BaO, SrO, CaO, MgO, $Nb_2O_5$, $P_2O_5$, $V_2O_5$, $CoO_3$, $Fe_2O_3$, $Cr_2O_3$, CuO, and NiO. For ferritic stainless steel substrates and low carbon steel substrates, tapes comprising alkali free or very low alkali glasses and filler comprising quartz, $TiO_2$, $ZrO_2$, and $Al_2O_3$ are also envisioned. Conventional leaded glasses (containing PbO) may also be used.

For copper, aluminum, and austenitic stainless steel substrates—having relatively high TCEs—tapes comprising the added filler cristobalite, preferably α-cristobalite, are envisioned. For copper or austenitic stainless steel substrates, tapes comprising alkali-free or low-alkali glasses and α-cristobalite are most preferred. It is believed that the addition of α-cristobalite to the solids portion helps to match the TCE of the resultant enamel coating to that of the substrate for substrates having relatively high TCEs.

Several representative glass compositions, including barium silicates, barium zinc silicates, barium aluminosilicates, barium borosilicates, zinc borosilicates, zinc bismuthates alkali-containing borosilicates are set forth in Table 1.

TABLE 1

Glass compositions for Tapes in weight percent.

| Oxide | I | II | III | IV | V | VI | VII | VIII |
|---|---|---|---|---|---|---|---|---|
| BaO | 30-80 | 40-70 | 1-10 | 5-20 | | | 0.1-20 | |
| $SiO_2$ | 20-70 | 5-40 | 20-70 | 20-55 | 25-85 | 20-75 | 30-80 | 5-50 |
| ZnO | | | 1-40 | 1-40 | | | 5-40 | |
| $B_2O_3$ | | 10-50 | 10-30 | 1-30 | 10-30 | 10-30 | 2-30 | 15-35 |
| $Bi_2O_3$ | | | | 5-25 | | | | |
| $Al_2O_3$ | 5-20 | | 0-10 | | | | 0-5 | 25-40 |
| $TiO_2 + ZrO_2$ | | 5-20 | 0.1-15 | 0.1-3 | | 0.1-30 | 0-10 | |
| $Li_2O + Na_2O + K_2O$ | | | 5-25 | 0.1-10 | 0.1-40 | 0.2-40 | 5-20 | |
| $V_2O_5 + P_2O_5$ | | | | | | 0.1-30 | | |
| CaO + MgO | | | 1-10 | 5-20 | | | | 15-45 |
| F | 0.1-5 | | 3-10 | 0.1-5 | | | | |
| $NO_2$ | | | | 1-3 | | 1-5 | | |

Inorganic fillers. Additional amounts of inorganic oxides, usually crystalline, may be added to affect the flow temperature and other properties of the glass composition above the Tg. Such oxides may also act as nucleating agents to promote partial or local crystallization. Suitable fillers include alumina, anorthite, bismuth oxide, boron oxide, fused silica, crystalline silica (i.e., quartz), magnesium cobalt spinel, molybdenum oxide, titania, titanates, magnesium silicate, calcium silicate, strontium silicate, barium silicate, magnesium titanate, calcium titanate, strontium titanate, barium titanate, eucryptite (both the α- and β-forms are suitable), cordierite, cobalt oxide, chromium oxide, tungsten oxide, zinc oxide, cristobalite (both the α- and β-forms are suitable), zircon, and zirconia, among others. Alpha-cristobalite is most preferred.

Pigments. Pigments may be added for decorative purposes and to improve adhesion to the substrate. The tape composition may also include a mixed metal oxide pigment. Typical mixed metal oxide pigments used to produce black colors in the automotive industry include oxides of copper, chromium, iron, cobalt, nickel, manganese, and other transition metals. Blue pigments are typically based on oxides of cobalt and aluminum, and chromium oxides may further be present. Green pigments are typically based on oxides of cobalt and chromium, cobalt and titanium or chromium oxide alone. The pigment generally constitutes about 1 wt % to about 40 wt %, preferably about 5 wt % to about 30 wt %, more preferably about 10 wt % to about 25 wt % of the ceramic enamel compositions herein, depending upon the range of color, gloss, and opacity desired.

Useful pigments may come from several of the major classifications of complex inorganic pigments, including corundum-hematite, olivine, priderite, pyrochlore, rutile, spinel, though other categories such as baddeleyite, borate, garnet, periclase, phenacite, phosphate, sphene and zircon are useful.

Conductive Metals. Conductive metals are used when a conductive pathway is desired. Metals useful in such embodiments include aluminum, nickel, copper, silver, gold, platinum and palladium, and mixtures thereof. Such metals can be deposited by making green tapes (with or without a suitable glass powder) or by screen-printing.

Organics. The green tape slurry includes an organics portion, which in turn, includes a thermoplastic polymer, a plasticizer, solvent and optionally a dispersant (wetting agent). In one embodiment, the slurry comprises about 25 wt % to about 55 wt %, preferably about 30 wt % to about 55 wt %, more preferably about 33 wt % to about 47 wt % of organics. During drying and firing of the green tape, the organics portion is volatilized (evaporated or combusted) leaving only the glassy portions. Each organic component is detailed in turn.

Thermoplastic Polymer: The green tape comprises about 5 wt % to about 15 wt %, preferably about 6 wt % to about 12 wt %, more preferably about 8 wt % to about 10 wt % of a thermoplastic polymer resin. A wide variety of thermoplastic polymers are suitable in the invention, including polyolefins, polyvinyl chloride, polyvinyl butyral, polyacrylics, polyamides, polyesters, polyphenylene sulfides, polystyrenes, polyoxymethylenes, polyoxyethylenes, and polycarbonates. The polymer resin used in the green tape is removed during the firing step. The thermal removal of polymer resin from the green tape starts at about 200° C. and thermal removal completion occurs at about 650° C. The thermal removal of polymer resin from the green tape involves multiple reaction steps such as evaporation, elimination of side groups, chain scission, cross-linking, cyclization, and thermal oxidation. The type and amount of polymer resin in the green tape also affects the polymer resin removal mechanism and temperature range. Processing variables such as firing atmosphere (e.g., air, nitrogen, hydrogen); gas flow rate, heating rate, and sample size also influence the degradation mechanism. For example, polyvinyl butyral (PVB) resin has a thermal degradation initiation temperature of about 300° C. and thermal degradation completion temperature of about 560° C. as measured by thermogravimetric analysis in air.

Plasticizer. The plasticizer may be any substance known to plasticize a thermoplastic polymer. Typically a green tape comprises about 2 wt % to about 8 wt %, preferably about 3 wt % to about 7 wt % of a plasticizer. Broadly, useful plasticizers herein include benzoates, phthalates, and succinates (i.e., esters), for example, dipropylene glycol dibenzoate, dipropylene glycol monobenzoate, propylene glycol dibenzoate, tripropylene glycol dibenzoate, diethylene glycol dibenzoate, diethylene glycol monobenzoate, ethylene glycol dibenzoate, triethylene glycol dibenzoate, dioctyl phthalate, glyceryl ethylhexanoate benzoate, isononyl benzyl succinate, and butyl benzyl phthalate, though others known in the art may be suitable. Broadly, plasticizers sold by Ferro Corporation, Cleveland, Ohio under the Santicizer® trademark are suitable.

Dispersant. A dispersant serves to ensure proper wetting of glass powder particles with the constituents of the organic component such as thermoplastic polymer, plasticizer and solvent. The dispersant may be a surfactant, having both polar and non-polar functionalities. The green tape comprises about 0.1 wt % to about 5 wt % of a dispersant. Suitable dispersants sold under the BYK® or Disperbyk® trademarks from BYK-Chemie of Wesel, Germany, include BYK110 (solution of copolymer with acidic group); BYK 111 (copolymer with acidic groups); BYK-180 (alkylolammonium salt of an acidic polyester). Also suitable are Duomeen® TDO (Akzo Nobel); Solsperse® 36600, a proprietary polymer mixed with aromatic hydrocarbon solvent; Solsperse® 13240, a mixture of polymeric amide and toluene; Solsperse® 20000, polymeric alkoxylate, and Aerosol® TR-70, sodium bistridecyl sulfosuccinate in water and ethanol. The Solsperse® and Aerosol® products are available from the Lubrizol Corporation of Cleveland, Ohio. Suitable wetting agents include Silvet® L-77, which is modified heptamethylsiloxane from Silberline Corporation, Tamaqua, Pa.

Solvent. Exemplary solvents include toluene, ethanol, methanol, methyl isobutyl ketone, methyl ethyl ketone and cyclohexanone. The green tape comprises about 0.01 wt % to about 5 wt % of a solvent, preferably about 0.1 wt % to about 3 wt %. Other organic solvents may be suitable.

Tackifying resin. The tape organics may in addition to the above mentioned ingredients also contain any tackifying resin disclosed elsewhere herein. It is advantageous when the tackifying resin in the tape organics is the same as, or is compatible with, the tackifying resin used in the separate adhesive (glue) coating. The green tape may comprise about 0.1 wt % to about 20 wt % of a tackifying resin.

Lamination of a green tape. A green tape is placed on a partially dried thin tacky coating of a tackifying resin on a substrate. The green tape used herein may be applied with minimal lamination pressure, such as that which may be applied by hand, about 200 psi or less, preferably about 100 psi or less, more preferably 50 psi or less, and most even 25 psi or less.

Applications of the inventive methods and coated substrates include metal-cored substrates comprising integrated heating elements, household appliances, automotive applications and solid-state lighting. In particular, household appliances include cooking ovens, ceramic cooktops, washing machines, clothes dryers, bread makers, heated shelves, food warming trays, teapots, coffee makers, water heaters, and rice/vegetable steamers. Automotive applications include thick film electronic circuitry on metal applications such as weight sensors, seat heaters, antilock brake systems, automotive exterior lighting and coatings on any automotive glass, including windshields, sidelights and backlights. Electronic applications include MLCC (multiplayer chip capacitor), LTCC (low temperature co-fired ceramic), HTCC (high temperature co-fired ceramic), and IMS (insulated metal substrates). Lighting applications such as outdoor stadium lighting, solid state lighting for traffic signals, and LED based lighting are envisioned.

Firing. In general, depending on the particular substrate, tape composition, and mass of the part, the firing can be carried out at peak temperatures (i.e., furnace set temperatures) of about 500° C. to about 1050° C., preferably about 600° C. to about 850° C., and in some cases from about 650° C. to about 750° C. Some combinations of tapes and substrates permit firing at temperatures as low as about 350° C., or as high as about 900° C. The firing profile may only include a few minutes at the peak temperature, for example about 2 to about 20 minutes, about 3 to about 18, about 5 to about 15 or about 4 to about 6 minutes at the peak temperatures listed above. After firing, the fired part will be allowed to cool to room temperature.

EXAMPLES

The Examples that follow serve only to illustrate various embodiments of the invention, and do not limit the invention in any way. The details of the exemplary solids portions of the tapes are set forth in Table 2. The solids portion comprises a glass component, and may further comprise one or more fillers and one or more pigments. The ingredients in the various tables are as follows. The glass frit compositions in Table 2: BAS-82 is a barium aluminosilicate glass; BBS-2 is a barium borosilicate glass containing titania; 6119 is an alkali zinc borosilicate containing alkaline earth oxides; 6120 is an alkali zinc barium borosilicate; EG2755 is a borosilicate glass; GL4317 is an alkali titanium silicate glass containing, $P_2O_5$, $V_2O_5$; S46/6 is a low alkali zinc borosilicate glass; EG0026 is a calcium aluminum borosilicate glass, and ME 6111DA is a black enamel powder. V9250 is a blue pigment. Santicizer® 160 is a plasticizer. Each of the foregoing product names represents glass frit/enamel products commercially available from Ferro Corporation, of Cleveland, Ohio. BYK®110 and BYK®180 are dispersants available from BYK Chemie, Wesel, Germany. PVB is polyvinyl butyral resin, available from Monsanto Corporation, St. Louis, Mo. Zircon is $ZrSiO_4$ and zirconia is $ZrO_2$. Tape slurry formulations, tape laminating conditions, type of tackifier resin used and tape firing conditions are shown in Tables 3 and 4.

TABLE 2

Exemplary tape solids portion component compositions (in weight %).

| Mix | Glass 1 | Glass 2 | Filler 1 | Filler 2 | Filler 3 | Filler 4 | Pigment |
|---|---|---|---|---|---|---|---|
| MIX A | ME6111DA (100%) | | | | | | |
| MIX B | BAS-82 (44%) | BBS-2 (36%) | Quartz (20%) | | | | |
| MIX C | 6119 | 6120 | Quartz | Zircon | $ZrO_2$ | | |

TABLE 2-continued

Exemplary tape solids portion component compositions (in weight %).

| Mix | Glass 1 | Glass 2 | Filler 1 | Filler 2 | Filler 3 | Filler 4 | Pigment |
|---|---|---|---|---|---|---|---|
| MIX D | (33.3%) 6119 | (33.3%) 6120 | (13.4%) Cristobalite | (10%) Zircon | (10%) ZrO$_2$ | | V9250 (2%) |
| MIX E | (33.4%) EG2755 | (33.4%) | (13.4%) Fused Silica (60%) | (10%) | (10%) | | |
| MIX F | (40%) BAS-82 19.6% | BBS-2 53.9% | Cristobalite (24.5%) | | | | V9250 (2%) |
| MIX G | GL4317 78.4% | | Cristobalite (19.6%) | | | | V9250 (2%) |
| MIX H | S-46/6 (65%) | | Cristobalite (24%) | TiO$_2$ (3%) | ZrO$_2$ (3%) | Alumina (3%) | V9250 (2%) |

TABLE 3

Tape slurry formulations. All values are weights in grams.

| Example | 1 | 2 | 3 | 4 | 5 |
|---|---|---|---|---|---|
| Glass Mix used from Table 2 | MIX H | MIX D | MIX G | MIX F | MIX A |
| Powder weight | 55.7 | 57.8 | 54.7 | 60.4 | 62 |
| BYK110 | 0.6 | 0.6 | 0.7 | 0.7 | 0.3 |
| BYK180 | 0.5 | 0.6 | 0.7 | 0.7 | 0 |
| Toluene | 16.2 | 15.9 | 16.4 | 14.2 | 14.4 |
| Ethanol | 16.2 | 15.9 | 16.4 | 14.2 | 14.4 |
| Cyclohexanone | 0.3 | 0.6 | 0.3 | 0.3 | 0.3 |
| PVB Resin | 6.7 | 6.0 | 7.2 | 6.4 | 5.72 |
| Santicizer-160 | 3.8 | 3 | 3.7 | 3.3 | 2.95 |
| Dried Tape name | T1 | T2 | T3 | T4 | T5 |

In all examples herein, the lamination pressure was under 100 psi and the lamination was carried out at room temperature, 22° C., and 50% relative humidity. The thermal degradation initiation and completion temperatures for the tackifier resin used were respectively lower than those of the resin used in the green tape for all examples.

TABLE 4

Tackifier, substrate, laminating and firing conditions of Examples 1-5.

| Example | 1 | 2 | 3 | 4 | 5 |
|---|---|---|---|---|---|
| Tape Used | T1 | T2 | T3 | T4 | T5 |
| Tackifying Resin | Sylvaros PR R-85 | Sylvaros PR R-85 | Sylvaros PR R-85 | Sylvaros PR R-85 | Abitol-E |
| Substrate | 304 SS, 316 SS & 430 SS | 304 SS, 316 SS & 430 SS | AL3003 | 304 SS, 316 SS & 430 SS | 430 SS, Low carbon steel for Enameling |
| Peak Firing Temp ° C. | 750-820 | 750-820 | 500-600 | 750-820 | 750-820 |

Austenitic stainless steel 304 and 316 substrates and ferritic stainless steel 430 substrates with a thickness of about 40 mils were cleaned using a soap solution. Some substrates were also cleaned using a dry sand blaster (120 grit alumina grains).

Details of the glue application are shown in Table 4. A tackifier glue solution was prepared by dissolving 30 grams of Sylvaros® PR R-85 in 70 grams of toluene. The glue solution was applied to the substrates by dipping the substrate in the glue solution. The substrate was dried for about 2 minutes at room temperature to form a thin (<70 microns) tacky layer on the substrate. The green tape with a polyester backing was placed on the tacky substrate surface with the ceramic side towards the substrate. The tape was gently pressed on the substrate to avoid bubbles and defects using a lamination pressure substantially less than 100 psi. Sylvaros® PR R-85 has a lower thermal decomposition initiation temperature (about 225° C.) and thermal degradation termination temperature (about 550° C.) compared to PVB resin used in the green tape. The thermal degradation initiation temperature of PVB is about 350° C., and its thermal degradation completion temperature is about 560° C. Approximately 95% of the glue is removed by about 400° C. where as only about 85% of the resin PVB is removed by 400° C.

After gluing the green tape T1 to the substrate, the resulting monolith is fired using either a belt furnace or a box furnace at 780° C. for 18 minutes and cooled. The fired surface was very smooth and showed no shrinkage in the XY plane. The steel substrate had very minimal bow. Samples for electrical testing were prepared by screen-printing and co-firing commercially available Ferro resistor paste HR81-0.010 and Ferro conductor paste CN34-001 at 650° C. for 10 minutes using a belt furnace. Some samples were also prepared by using Ferro overglaze OG15-339, which was fired at 610° C. for 10 minutes using a belt furnace over the pre-fired conductor and resistor pattern. Table 5 shows the electrical insulation Example 1

Solids composition MIX H (Table 2) was slurried in accordance with the formulation of Table 3. To prepare 100 grams of Tape 1 slurry, 55.7 grams of MIX H was mixed with 32.4 grams of a 1:1 toluene-ethanol blend and about 0.3 grams of cyclohexanone. BYK® 110 and BYK® 180 dispersants, (0.6 grams of each) were added. Polyvinyl butyral resin, (6.7 grams) from Monsanto and Santicizer® 160 plasticizer from Ferro Corporation (3.8 grams) were blended and ball milled at room temperature. The resultant slurry was cast on a polyester film (about 50-75 microns thick) using a doctor blade to obtain a dried green tape sheet (T1) with thickness of about 100 to 150 microns.

properties of the tape samples tested. Parts showed excellent electrical insulation under both DC (>1000 VDC/mil) and AC (>400 VAC/mil) voltage conditions.

Example 2

The slurry preparation differs from Example 1 in that solids MIX D (Table 2) was slurried to the formulation of Example 2 in Table 3. Green tape T2 was glued to each of a 304, 316 and a 430 stainless steel substrate using tackifier resin Sylvaros® PR R-85.

Example 3

The slurry preparation differs from Example 1 in that solids MIX G (Table 2) was slurried to the formulation of Example 3 in Table 3. The green tape was glued to an aluminum substrate (AL3003) using tackifier resin Sylvaros® PR R-85.

Example 4

The slurry preparation differs from Example 1 in that solids MIX F (Table 2) was slurried to the formulation of Example 4 in Table 3. Green tape T4 was glued to each of a 304, 316 and a 430 stainless steel substrate using tackifier resin Sylvaros® PR R-85.

Example 5

The slurry preparation differs from Example 1 in that solids MIX A (Table 2) was slurried to the formulation of Example 5 in Table 3. Glass MIX A is used for applying a porcelain enamel coating to low carbon steel. The green tape T5 was glued to a 430 stainless steel, and to a low carbon enameling steel substrate using tackifier resin Abitol®-E.

All exemplary tapes were laminated by hand using less than 100 psi pressure, and were fired at the peak temperature for 6 to 20 minutes.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

The invention claimed is:

1. A green tape adhered onto a substrate by a tackifying resin to form a laminate, the green tape comprising:
   cristobalite;
   at least one glass composition selected from the group consisting of glass composition 1, glass composition 2, glass composition 3, glass composition 4, glass composition 5, glass composition 6, glass composition 7, and glass composition 8, and combinations thereof;
   0.1 wt % to about 20 wt % of a tackifying resin that is the same resin as the tackifying resin that adheres the green tape onto the substrate, wherein
   the green tape has a thickness of about 10 microns to about 1 mm,
   a. glass composition 1 comprises:
      i. about 30 to about 80 wt % BaO and
      ii. about 20 to about 70 wt % $SiO_2$;
   b. glass composition 2 comprises:
      i. about 40 to about 70 wt % BaO, and
      ii. about 5 to about 40 wt % $SiO_2$
   c. glass composition 3 comprises:
      i. about 1 to about 40 wt % ZnO, and
      ii. about 20 to about 70 wt % $SiO_2$,
   d. glass composition 4 comprises:
      i. about 1 to about 40 wt % ZnO,
      ii. about 20 to about 55 wt % $SiO_2$, and
      iii. about 1 to about 30 wt % $B_2O_3$,
   e. glass composition 5 comprises:
      i. about 25 to about 85 wt % $SiO_2$,
      ii. about 10 to about 30 wt % $B_2O_3$, and
      iii. about 0.1 to about 40 wt % ($Li_2O+Na_2O+K_2O$),
   f. glass composition 6 comprises:
      i. about 20 to about 75 wt % $SiO_2$,
      ii. about 0.2 to about 40 wt % ($Li_2O+Na_2O+K_2O$),
      iii. about 0.1 to about 30 wt % ($TiO_2+ZrO_2$), and
      iv. about 0.1 to about 30 wt % ($V_2O_5+P_2O_5$),
   g. glass composition 7 comprises:
      i. about 30 to about 80 wt % $SiO_2$,
      ii. about 0.1 to about 20 wt % BaO,
      iii. about 5 to about 40 wt % ZnO, and
      iv. about 2 to about 30 wt % $B_2O_3$, and
   h. glass composition 8 comprises:
      i. about 5 to about 50 wt % $SiO_2$,
      ii. about 15 to about 45 wt % CaO,
      iii. about 25 to about 40 wt % $Al_2O_3$, and
      iv. about 15 to about 35 wt % $B_2O_3$.

2. The green tape of claim 1, wherein the cristobalite is α-cristobalite.

3. The green tape of claim 2, wherein the at least one glass composition is selected from the group consisting of glass composition 2 and glass composition 7, and combinations thereof.

4. The green tape of claim 2, wherein the at least one glass composition is selected from the group consisting of glass composition 5, glass composition 6, and combinations thereof.

5. A substrate selected from the group consisting of stainless steel, copper and aluminum coated with a fired green tape of claim 2.

6. A substrate selected from the group consisting of stainless steel and copper, coated with a fired green tape of claim 5.

7. A substrate comprising aluminum coated with a fired green tape of claim 6.

8. The green tape of claim 1 further comprising a zircon filler.

9. The green tape of claim 1 further comprising a zircon filler and titania filler.

10. The green tape of claim 1 further comprising a zircon filler and zirconia filler.

11. The green tape of claim 1 further comprising a titania filler.

12. The green tape of claim 1 further comprising a titania filler and zirconia filler.

13. The green tape of claim 1 further comprising a titania filler, zirconia filler, and alumina filler.

14. The green tape of claim 1 further comprising a pigment at about 1 wt % to about 40 wt %.

15. The green tape of claim 1 further comprising a thermoplastic polymer at about 5 wt % to about 15 wt %.

16. The green tape of claim 1 further comprising a plasticizer at about 2 wt % to about 8 wt %.

17. The green tape of claim 1 further comprising a dispersant at about 0.1 wt % to about 5 wt %.

18. The green tape of claim 1, wherein the at least one glass composition comprises the glass composition 5 comprising:
   i. about 25 to about 85 wt % $SiO_2$,
   ii. about 10 to about 30 wt % $B_2O_3$, and
   iii. about 0.1 to about 40 wt % ($Li_2O+Na_2O+K_2O$).

19. The green tape of claim 1, wherein the at least one glass composition comprises the glass composition 6 comprising:
  i. about 20 to about 75 wt % $SiO_2$,
  ii. about 0.2 to about 40 wt % $(Li_2O+Na_2O+K_2O)$,
  iii. about 0.1 to about 30 wt % $(TiO_2+ZrO_2)$, and
  iv. about 0.1 to about 30 wt % $(V_2O_5+P_2O_5)$.

* * * * *